United States Patent [19]

Corey et al.

[11] Patent Number: 4,907,628

[45] Date of Patent: Mar. 13, 1990

[54] PROCESS AND DEVICE FOR FORMING LEADS

[75] Inventors: Ronald J. Corey, Morris Township, Morris County; Theodore Stavisky, West Milford, both of N.J.

[73] Assignee: Fancort Industries, Inc., West Caldwell, N.J.

[21] Appl. No.: 264,140

[22] Filed: Oct. 28, 1988

[51] Int. Cl.[4] .............................................. B21F 1/00
[52] U.S. Cl. ................................................. 140/105
[58] Field of Search .................. 140/105; 72/294, 332, 72/335

[56] References Cited

U.S. PATENT DOCUMENTS 3,769,823 11/1973 Greeninger ........................ 72/335
3,796,201 3/1974 Golub ................................. 140/105

FOREIGN PATENT DOCUMENTS

| 108919 | 5/1988 | Japan | 140/105 |
| 522880 | 8/1976 | U.S.S.R. | 140/105 |
| 605662 | 5/1978 | U.S.S.R. | 140/105 |
| 628979 | 10/1978 | U.S.S.R. | 140/105 |
| 761081 | 9/1980 | U.S.S.R. | 140/105 |
| 1103928 | 7/1984 | U.S.S.R. | 140/105 |

Primary Examiner—Robert L. Spruill
Attorney, Agent, or Firm—Mathews, Woodbridge, Goebel, Pugh & Collins

[57] ABSTRACT

Leads of an electronic component are formed in a Z-shaped configuration so as to provide a constant distance from the bottom surface of the body to the foot of the formed lead by a device having a lower floating anvil and complementary upper die unit, each of which have clamping and forming surfaces defining a Z-shaped joint therein between. The clamping surfaces are moveable relative to the forming surfaces of the anvil and the degree of movement which is permitted is controlled by preset sensing means responsive to contact with the body of the electronic component so as to produce the desired vertical distance between foot portion of the lead and the bottom surface of the component.

6 Claims, 7 Drawing Sheets

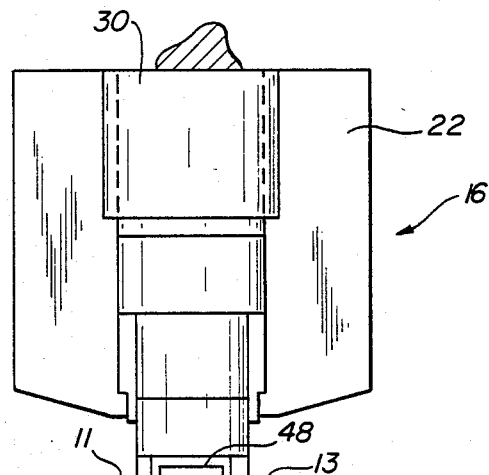
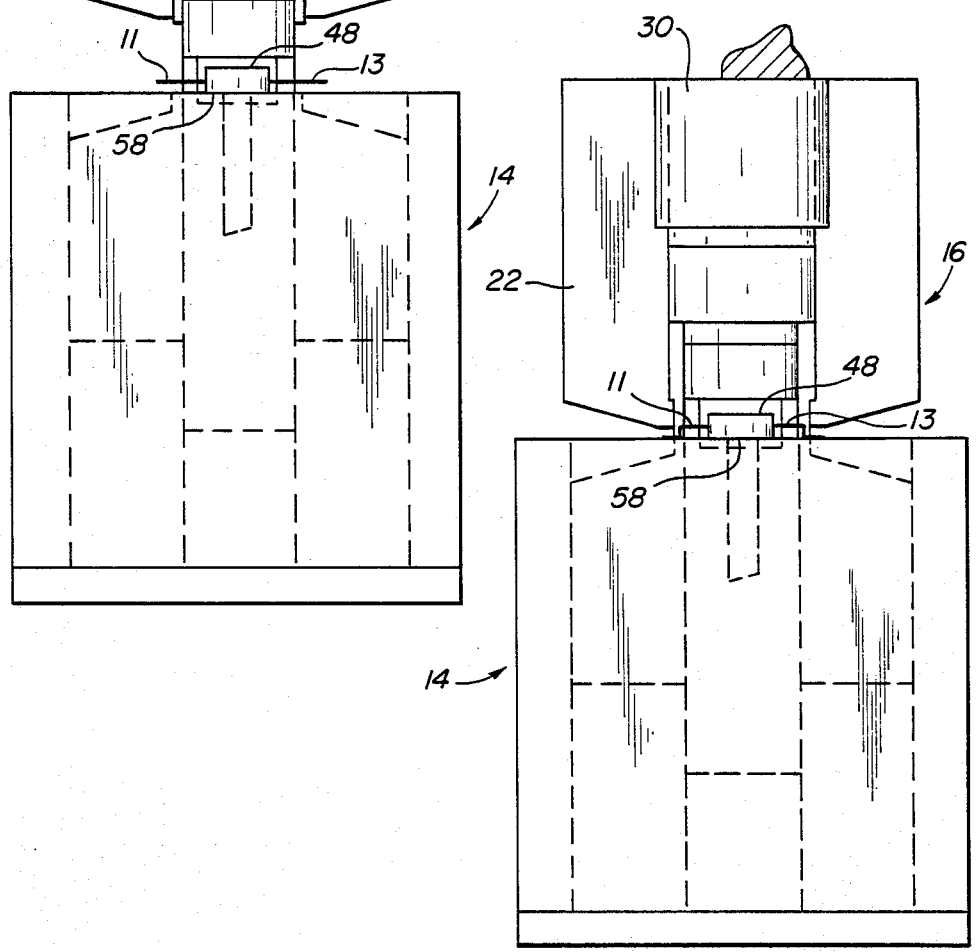

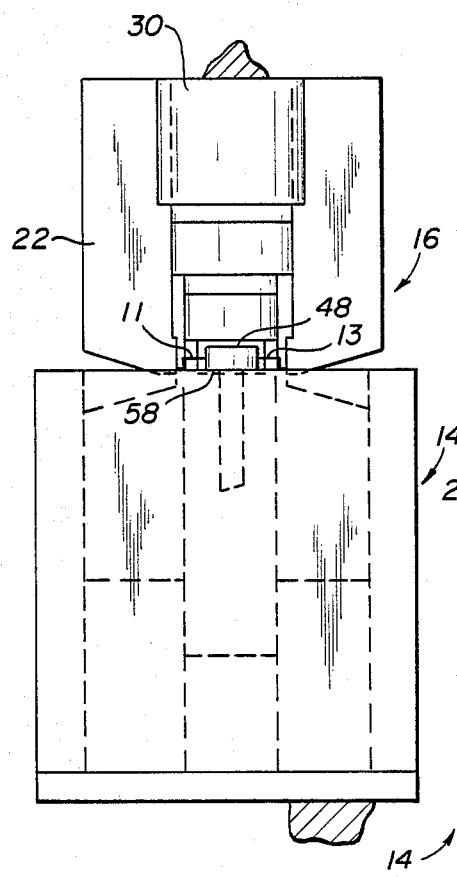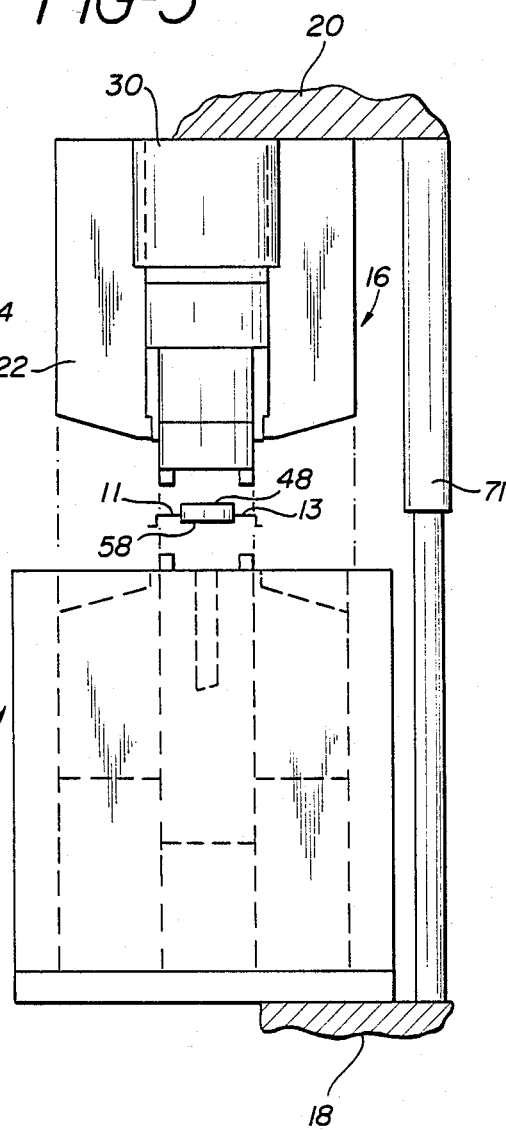

PROCESS AND DEVICE FOR FORMING LEADS

The present invention relates to a floating anvil die device for forming offset leads of an electronic component, and in particular to a process and device for forming leads of a roughly Z-shaped configuration within predetermined dimensions.

BACKGROUND OF THE INVENTION

Certain electronic components have a body portion with a plurality of leads extending therefrom. In the fabrication of the final component, the unformed planar leads will be formed into a generally Z-shaped configuration, i.e., having an upper horizontal portion emerging from the body of the electronic component, a lower foot portion, upon which the electronic component will rest when joined to the circuit surface, and an intermediate transverse portion.

A critical dimension to be generated in the forming process is the clearance dimension, that is, the vertical distance between the plane of the foot portion and the bottom surface of the body portion of the component. Variation will occur, however, in the point at which the leads emerge from the body of the component. Unless compensation for this variation is provided in the elevation of the intermediate transverse portion of the formed lead, unacceptable variation in the clearance dimension will result.

SUMMARY OF THE INVENTION

The present device forms the leads of an electronic component into the desired Z-shaped configuration while insuring the required constant distance from the bottom surface of the body to the foot of the formed lead. This is accomplished without the need to measure the variable distance from the point at which the unformed lead emerges from the body portion to the bottom surface of the body portion.

The device of the present invention includes a lower floating anvil and complementary upper die unit having clamping and forming surfaces defining a Z-shaped joint therein between. The clamping surfaces are moveable relative to the forming surfaces and the degree of this movement which is permitted is controlled by sensing means, responsive to contact with the body of the electronic component. These sensing means are set to produce the desired vertical distance between foot portion of the lead and the bottom surface of the body of the component.

DETAILED DESCRIPTION

The nature of the invention will be apparent from the following description of the preferred embodiment of the invention as illustrated in the accompanying drawings, in which:

FIGS. 2 through 5 are further elevation views corresponding to FIG. 1 but showing subsequent and sequential steps of operation;

Figure 1:
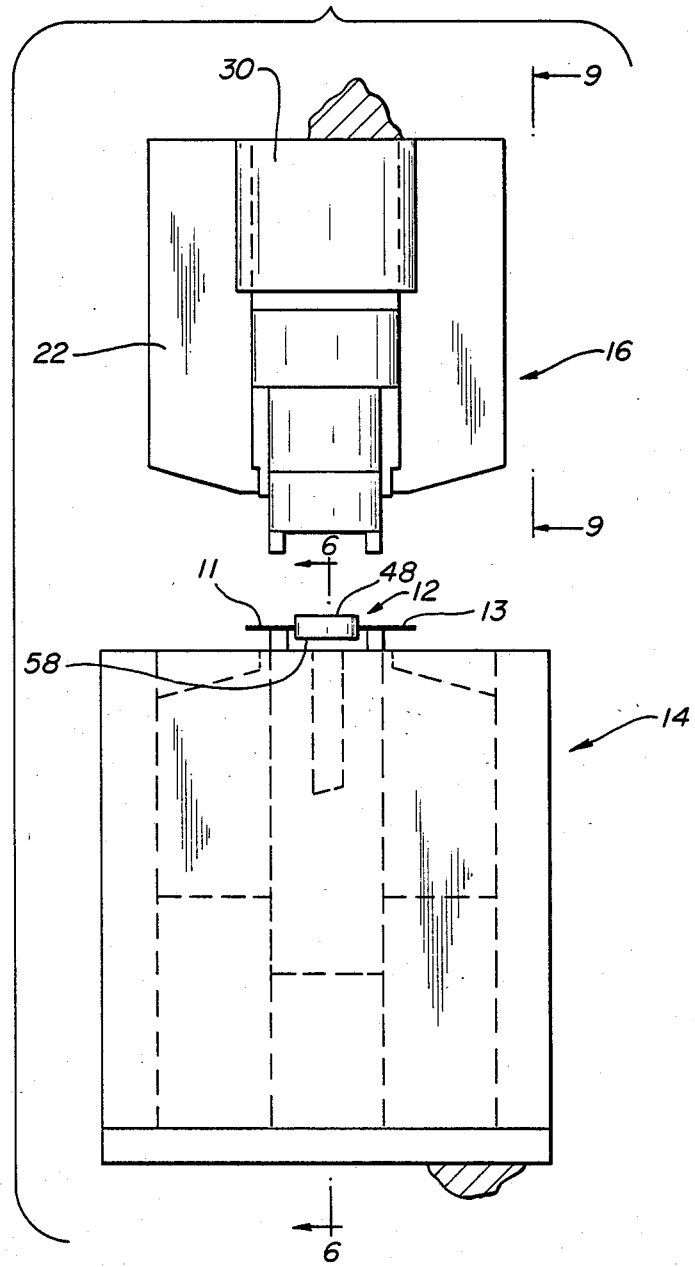
FIG. 1 is an elevation view of a device according to the invention.
Figure 10:
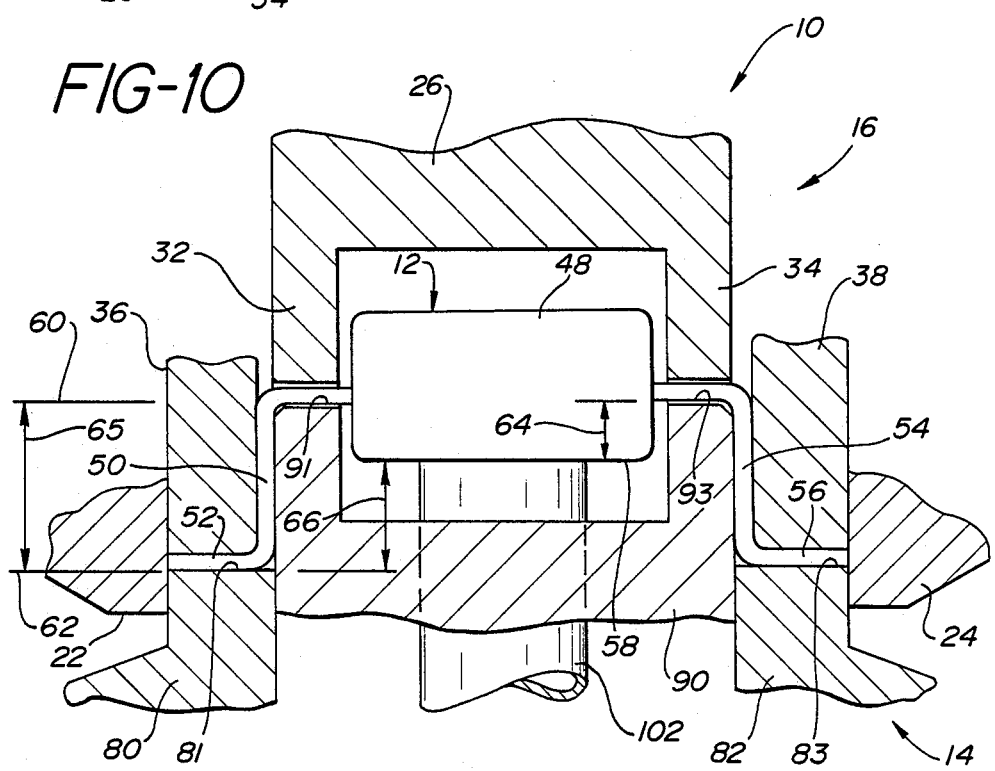
FIG. 10 is a sectional view taken along the line 10—10 of FIG. 6 but in its configuration corresponding to the stage of operation shown in FIG. 4.
Figure 11:
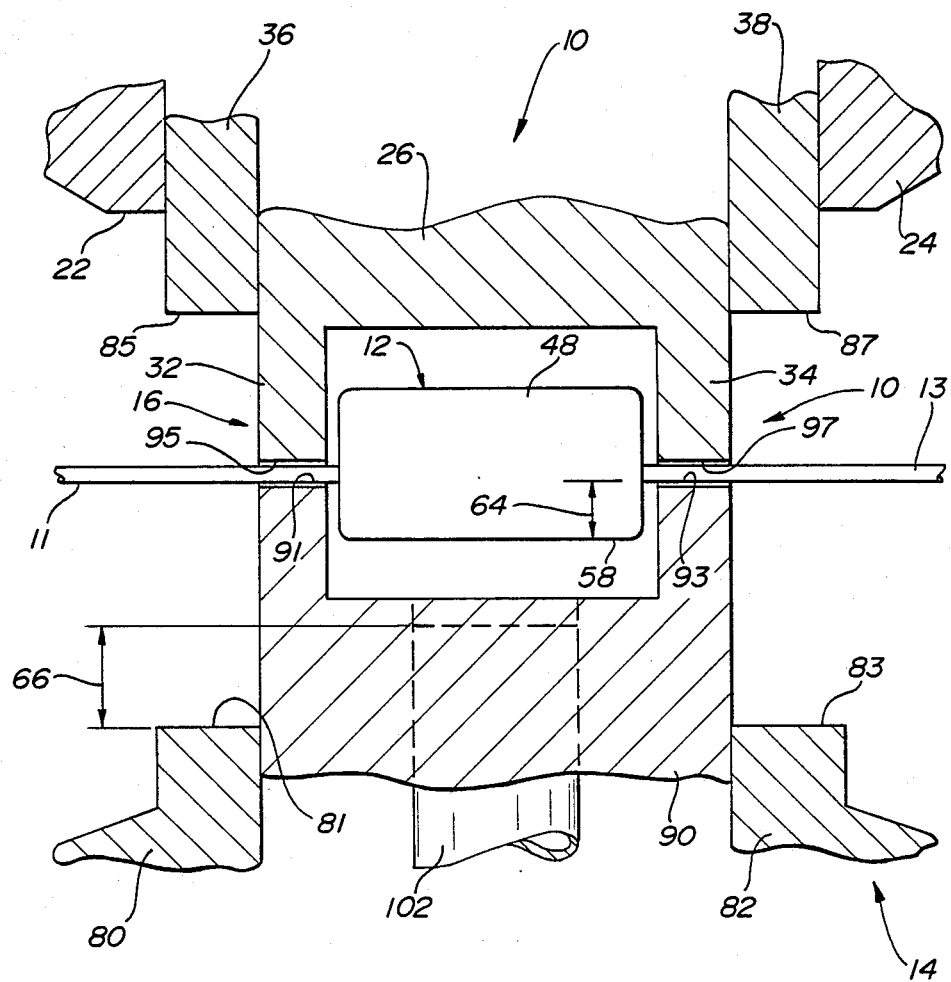
FIG. 11 is a further sectional view of the assemble shown in FIG. 10 but in its configuration prior to forming and corresponding to the stage of operation shown in FIG. 2.

Referring to FIGS. 1, 10, and 11, device 10 acts upon workpiece 12 which is an electronic component having a body portion 48 and unformed leads 11 and 13. Body portion 48 has a flush underside surface elevation 58. As shown in FIG. 11, workpiece 12 typically has a variable dimension 64, corresponding to the distance between bottom surface 58 and the point at which the initial portion of the lead emerges from body 48. The formed lead, however, must have a constant dimension for clearance 66 (see FIG. 10) which is the distance from surface 58 to plane 62 defined by the bottom surface of formed lead feet 52 and 56. Thus, dimension 65, which corresponds to the sum of dimensions 64 and 66, must be set for each workpiece by the operator. As explained hereafter, the present device permits facile setting of dimension 65 so as to thereby define a constant dimension 66 for each workpiece despite variation in dimension 64.

Device 10 includes a bottom anvil assembly 14 and an upper die unit 16. Bottom anvil assembly 14 and upper die unit 16 respectively have a bottom fixed support 18 and a top movable support 20.

Bottom anvil assembly 14 has a pair of horizontal lead forming surfaces, 81 and 91 on the left and 83 and 93 on the right, which are spaced from one another at a distance operable to receive and register with unformed leads 11 and 13 of electronic component 12 when body 48 of the electronic component 14 is disposed thereinbetween. These lead forming surfaces are composed of inner parallel clamping surfaces 91 and 93, defined on the inner clamping unit 90 of anvil assembly 14, and outer forming parallel surfaces 81 and 83 on outer forming units 80 and 82 of anvil assembly 14. Inner unit 90 of anvil assembly 14 and outer unit 80 and 82 of anvil assembly 14 are vertically adjustable relative to one another, as described below.

Figure 9:
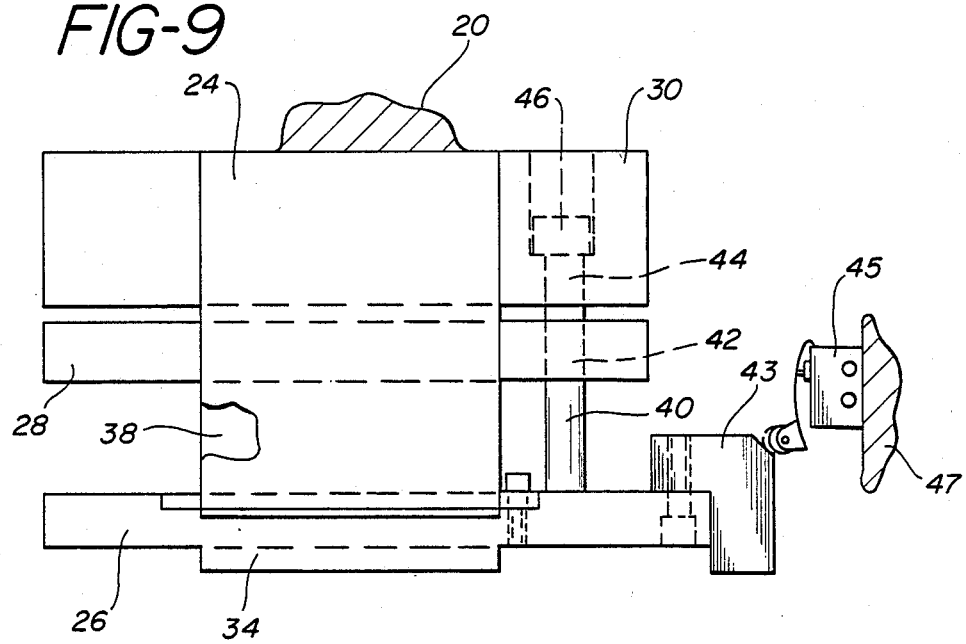
FIG. 9 is a sectional view taken along the line 9—9 of FIG. 1.

Upper die unit 16 similarly has a pair of lead forming surfaces, 85 and 95 on the left and 87 and 97 on the right. Each of these die unit lead forming surfaces is composed of inner parallel clamping surfaces 95 and 97 defined on inner dies 32 and 34 of inner die unit 26, which surfaces complement inner clamping surfaces 91 and 93 of the inner anvil unit 90, and outer forming surfaces 85 and 87 on outer dies 36 and 38 respectively, of outer die unit 28 (FIG. 9) which complement outer forming surfaces 81 and 83 of the outer anvil units 80 an 82, respectively. In the initial stages of the operation, as shown in FIGS. 1, 2, 9 and 11, outer die unit 28 is retracted so that dies 36 and 38 are above the plane of inner parallel clamping surfaces 95 and 97 of inner die unit 26. Upper die unit 16 is also composed of cutting unit 30 having cutting blades 22 and 24 for a purpose to be described below. A guide pin 40, having a head 46, extends through bores 44 and 42 in cutting unit 30 and outer die unit 28, respectively, to the upper surface of inner die unit 26. As seen in FIG 9, a cam block 43 is pinned to inner die unit 26 and operably mates with a switch means 45 mounted on the side portion 47 of top moveable support 20.

As seen in FIG. 1, electronic component 12 is placed in the device so that unformed leads 11 and 13 rest on anvil clamping surfaces 91 and 93 of inner anvil unit 90. First advancing means 71 (FIG. 5) selectively move inner die unit 26 and retracted outer dies 36 and 38 towards inner anvil unit 90 until inner clamping surfaces 95 and 97 engage leads 11 and 13 of electronic component 12, thereby cooperating with complementary inner clamping surfaces 91 and 93 of the inner anvil unit 90 to clamp portions of the leads 11 and 13 of electronic component 12 thereinbetween. The portions of the leads 11 and 13 engaged by the cooperation of inner clamping surfaces 95 and 97 and inner clamping surfaces 91 and 93 thus are held firmly in place with the remainder of the leads 11 and 13 then extending beyond inner die unit 26 and inner anvil unit 90, as shown in FIGS. 2 and 11.

Figure 6:
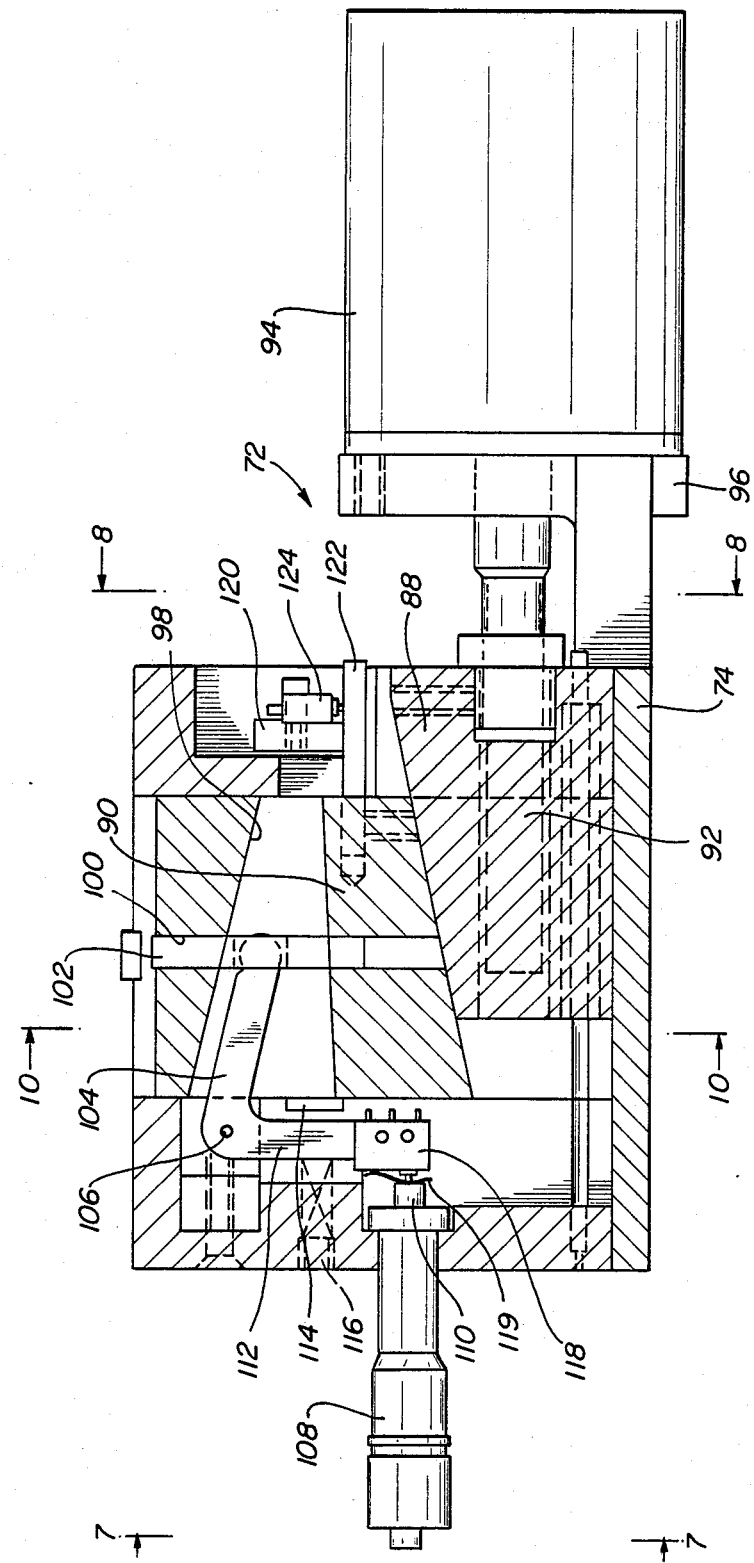
FIG. 6 is a sectional view taken along the line 6—6 of FIG. 1.
Figure 7:
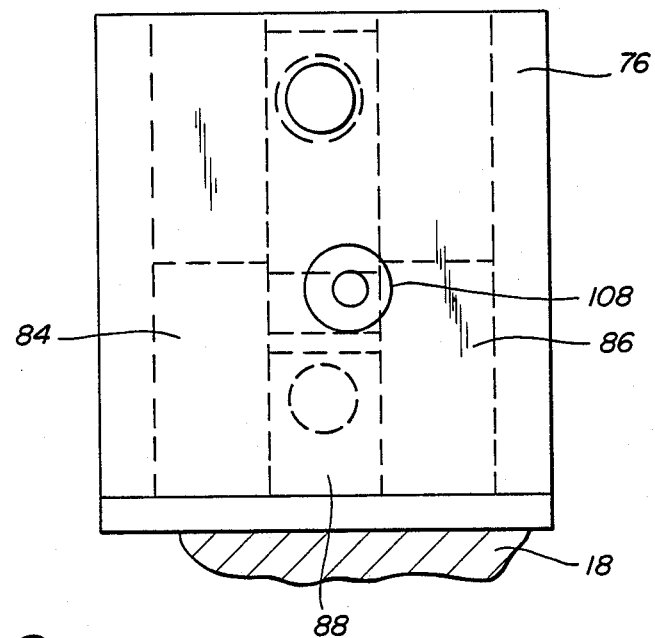
FIG. 7 is a sectional view taken along the line 7—7 of FIG. 6.
Figure 8:
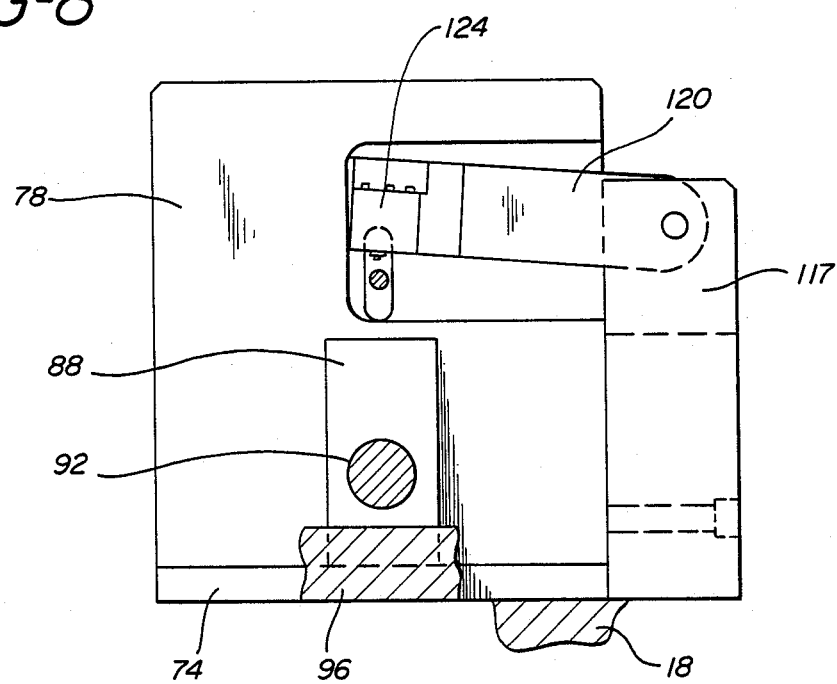
FIG. 8 is a sectional view taken along the line 8—8 of FIG. 6.

Second advancing means 72 then selectively advances inner die unit 26 and the inner anvil unit 90, as a unit and with leads 11 and 13 clamped thereinbetween, towards anvil outer forming surfaces 81 and 83 of outer anvil units 80 and 82. As shown in FIGS. 6 and 7, second advancing means 72 includes an incline driver 88, which is disposed between spacer blocks 84 and 86. Inclined driver 88 is reversibly displaced horizontally by threaded rod 92 which is driven by reversible motor 94 mounted on a motor support bracket 96, which is fixedly connected to plate 74. Inner anvil unit 90 is provided with transverse slot 98 which receives a portion of incline driver 88 and a vertically hole 100, in which a vertical disposed slideable pin 102 is received. Inner anvil unit 90 has an inclined lower surface complementing inclined driver 88 and thus inner anvil unit 90 is displaced vertically as inclined driver 88 is displaced horizontally. A rear cam assembly shown in FIGS. 6 and 8 includes pivot block 117, which is fixedly connected to rear wall 78, and supports pivotably mounted rear set cam 120. Pin 122 is fixedly connected to inner anvil unit 90 which when reaching a preset level engages switch means 124. Switch means 124 thus is operable to set the upper limit of inner anvil unit 90 by inactivating motor 94.

Sensing means comprises pin 102 disposed in hole 100, cam 104, and switch means 118. Cam 104 is angularly displaceable about pin 106 and engages slotted portion of pin 102 and carries switch 118 on arm portion 112. By adjustment of micrometer 108, which has a head portion 110 operable to engage switch 118 of cam 104, pin 102 can be raised or lowered. Opposing spring means 119 biases switch 118 to a normally closed position which bias is overcome by vertical pressure applied to pin 102 acting through cam 104. Backstop 114 and turning screw 116 check cam 104 in its travel, thus controlling the upper and lower limits of travel of pin 102.

Pin 102 is initially set by micrometer 108 so that the elevation of its upper surface above outer anvil surfaces 81 and 82 corresponds to dimension 66. As the top moveable support 20 and upper die unit 16 move down, the surfaces 45 and 47 will contact the upper surfaces of the unformed leads 11 and 13, respectively, causing inner die unit 26 to cease further downward motion. As such, the side portion 47 (FIG. 9) of top moveable support 20 will continue to move downwardly, causing switch means 45 to be operated as the cam follower thereon rides downwardly on the surface of cam block 43. This action energizes second advancing means 72 by activating motor 94 to move inclined driver 88 to the right as seen in FIG. 6. Second advancing means 72 advances inner die unit 26 and the inner anvil unit 90 downwardly as a unit towards over forming surfaces 81 and 83 of outer anvil units 80 and 82 until bottom surface 58 of the clamped electronic component 12 contacts pin 102. This contact causes cam 104 to rotate slightly about pin 106 causing switch 118 to open, thereby deactivating motor 94 and locking the clamped electronic component 48 at that predetermined elevation above outer forming surfaces 81 and 83 of outer anvil units 80 and 82.

With the deactivation of second advancing means 72, and as shown in FIG. 3, outer dies 36 and 38 of top assemble 16 then are advanced towards outer anvil units 80 and 82. Outer horizontal forming surfaces 85 and 87 engage unformed leads 11 and 13 and, in cooperation with complementing outer horizontal forming surfaces 81 and 83 of the outer anvil units 80 and 82, form the desired Z-configuration of the leads, namely the clamped unbent portion emerging from body 48, feet 52 and 56 and intermediate transverse portions 50 and 54. Because the sensing means 70 has previously positioned inner anvil unit 90 relative to outer anvil units 80 and 82 at precisely the correct elevation, an elevation of resulting intermediate transverse potions 50 and 54 is produced which provides a final clearance corresponding to dimension 66.

When the leads have been formed in the desired Z-configuration, cutting blades 22 and 24 are advanced as shown in FIG. 4 to sever those portions of the electronic component leads extending beyond the upper die forming unit 16. As shown in FIG. 5, the entire upper die unit 16 then is retracted to free the formed component 48 (shown lifted away in FIG. 5 for illustrative purposes).

While the invention has been described in its preferred embodiment, it is to be understood that the words which have been used are words of description rather than limitation and that changes may be made within the purview of the appended claims without departing from the true scope and spirit of the invention in its broader aspects.

What is claimed is:

1. A device for forming offset leads of an electronic component which comprises:
   (a) an anvil assembly having an inner clamping unit with raised parallel edges and a pair of adjacent outer forming units, said inner clamping unit parallel edges and said outer forming units defining a pair of horizontal lead forming surfaces spaced from one another at a distance operable to receive the unformed leads of an electronic component with the body of the electronic component disposed between said lead forming surfaces, said inner clamping unit and said outer forming unit being vertically adjustable relative to one another;
   (b) an upper die assembly having inner clamping unit and a pair of outer forming units defining lead forming surfaces, said upper die lead forming surfaces complementing said anvil forming surfaces;
   (c) first advancing means operable to reversibly and selectively advance the inner clamping unit of said upper die assembly towards the complementary inner clamping units of said anvil assembly and to clamp therein between a first portion of the leads of an electronic component resting on said anvil clamping units with a second portion of the leads extending beyond the inner clamping units of the upper die assembly and anvil assembly;

(d) second advancing means operable to advance the inner clamping units of the upper die assembly and the inner clamping units of the anvil assembly as a unit towards said anvil outer forming units;

(e) sensing means operable to detect the advancement of the clamped electronic component to a predetermined point above said anvil outer forming units and upon such detection to deactivate said second advancing means for maintenance of the clamped electronic component at that predetermined point;

(f) adjusting means operable to selectively set the predetermined point above said anvil outer forming unit at which said sensing means detects the body of the clamped electronic component; and (g) means operable to advance said upper die unit outer forming units into lead forming relationship with said anvil outer forming units.

2. The device according to claim 1 wherein the second advancing means comprise an incline driver slideably mounted below said anvil inner clamping units.

3. The device according to claim 2 wherein the second advancing means comprise a reversible motor having a shaft threaded into said incline driver, said motor being responsive to said sensing means.

4. The device according to claim 1 wherein said sensing means comprises a pin disposed vertically in said anvil inner clamping unit between said anvil lead forming surfaces, said pin being linked mechanically to switch means operable to deactivate said second advancing means.

5. The device according to claim 4 wherein said pin is linked to said switch means through cam means and said adjusting means comprises a micrometer operable to angularly displace said cam means and vertically displace said pin.

6. The device according to claim 1 wherein a cutting blade is disposed outside the outer forming units of the upper die unit and further comprising means operable to advance said cutting blade to sever those portions of the electronic component leads extending beyond the upper die unit and anvil outer forming units.

* * * * *